United States Patent [19]
Rault

[11] Patent Number: 5,657,195
[45] Date of Patent: Aug. 12, 1997

[54] OVERCURRENT PROTECTION DEVICE

[75] Inventor: Pierre Rault, Saint Cyr sur Loire, France

[73] Assignee: SGS-Thomson Microelectronics S.A., Saint Genis, France

[21] Appl. No.: 421,694

[22] Filed: Apr. 12, 1995

[30] Foreign Application Priority Data

Apr. 13, 1994 [FR] France ................... 94 04680

[51] Int. Cl.$^6$ ........................................ H02H 3/18
[52] U.S. Cl. ................. 361/86; 361/58; 361/100; 361/115
[58] Field of Search .............. 361/58, 93, 100–101, 361/79, 86–87, 88–89, 94, 98, 115; 307/125

[56] References Cited

U.S. PATENT DOCUMENTS

| | | | |
|---|---|---|---|
| 3,792,289 | 2/1974 | Kazem | 307/125 |
| 3,916,220 | 10/1975 | Roveti | 307/251 |
| 4,513,343 | 4/1985 | Ryczek | 361/101 |
| 4,593,213 | 6/1986 | Vesce et al. | 307/564 |
| 4,733,319 | 3/1988 | Yoshida et al. | 361/58 |

FOREIGN PATENT DOCUMENTS 0404692  12/1990  European Pat. Off. ......... H02H 3/02

OTHER PUBLICATIONS

French Search Report from French application 94 04680.

*Primary Examiner*—Jeffrey A. Gaffin
*Assistant Examiner*—Michael J. Sherry
*Attorney, Agent, or Firm*—Wolf, Greenfield & Sacks, P.C.; James H. Morris; Brett N. Dorny

[57] ABSTRACT

An overcurrent protection device designed to be connected in series between a load and an electric supply includes a switch which is controlled by a voltage present across a current limiting device. The switch is formed by a GTO thyristor connected in series with the current limiting device. The output of the current limiting device is connected to the load.

36 Claims, 1 Drawing Sheet

OVERCURRENT PROTECTION DEVICE

BACKGROUND OF THE INVENTION

1. Field of the Invention

The present invention relates to a static breaker designed to protect a load fed by a voltage of a few hundred volts.

The invention more particularly relates to a device, including an electronic circuit, for protecting a load against overcurrents.

2. Discussion of the Related Art

Available breakers are fuses, resistors with a positive temperature coefficient, and electromagnetic breakers.

These devices have the following drawbacks: fuses can be used only once, and must be replaced after each use; resistors with a positive temperature coefficient have a long response time and their use is limited to low-power loads; electromagnetic breakers have a long response time and a high manufacturing cost.

Electronic circuits acting as static breakers and using solid-state switches are also known. Such circuits must have a very fast response time in case of a short-circuit in the load because of the high currents flowing during a short-circuit. This requires the manufacturing of complex and therefore expensive electronic circuits.

SUMMARY OF THE INVENTION

An object of the present invention is to provide an electronic circuit having a simple structure and a low cost, that constitutes an overcurrent protection device and provides an optimum operational reliability as a load protection component.

To achieve this object, the present invention provides an overcurrent protection device designed to be connected in series between a load and an electric supply, including a switch which is controlled by a voltage present across a current limiting device.

According to an embodiment of the present invention, the switch is formed by a gate turnoff (GTO) thyristor, which is connected in series with the current limiting device. The cathode of the GTO thyristor is connected to the input of the current limiting device, and the anode of the GTO thyristor receives the supply voltage. The output of the current limiting device is connected to the load, and a first high-value resistor is disposed between the gate and the anode of the GTO thyristor.

According to an embodiment of the present invention, the device includes an avalanche diode, connected in parallel with the current limiting device and designed to set the turn-off threshold of the switch formed by the GTO thyristor.

According to an embodiment of the present invention, the device includes an auxiliary thyristor, designed to control the turn-off of the GTO thyristor as soon as the voltage across the current limiting device reaches the threshold fixed by the avalanche voltage of the diode. The gate of the auxiliary thyristor is connected to the anode of the avalanche diode and its cathode is connected to the output of the current limiting device, whereas its anode is connected to the gate of the GTO thyristor.

According to an embodiment of the present invention, the device further includes a second resistor, connected between the gate and the cathode of the auxiliary thyristor, which is designed to absorb, during normal operation, the leakage current flowing through the diode.

According to an embodiment of the present invention, the current limiting device and the GTO thyristor are selected so that the current limitation value "Icl" of the current limiting device is lower than the value of the maximum turn off current of the GTO thyristor.

Using a current limiting device of the invention significantly simplifies the structure of the circuit. Indeed, the circuit is no longer at risk of being damaged by a high current flowing through the load at the beginning of the shorting phase, during the response time of the switch. Therefore, the switch no longer needs to be controlled very rapidly. Moreover, since the components used are not at risk of being subjected to an overcurrent, the components can have a small size and thus occupy a small silicon surface area.

The foregoing and other objects, features, aspects and advantages of the invention will become apparent from the following detailed description of the present invention when taken in conjunction with the accompanying drawings.

DETAILED DESCRIPTION

Figure 1:
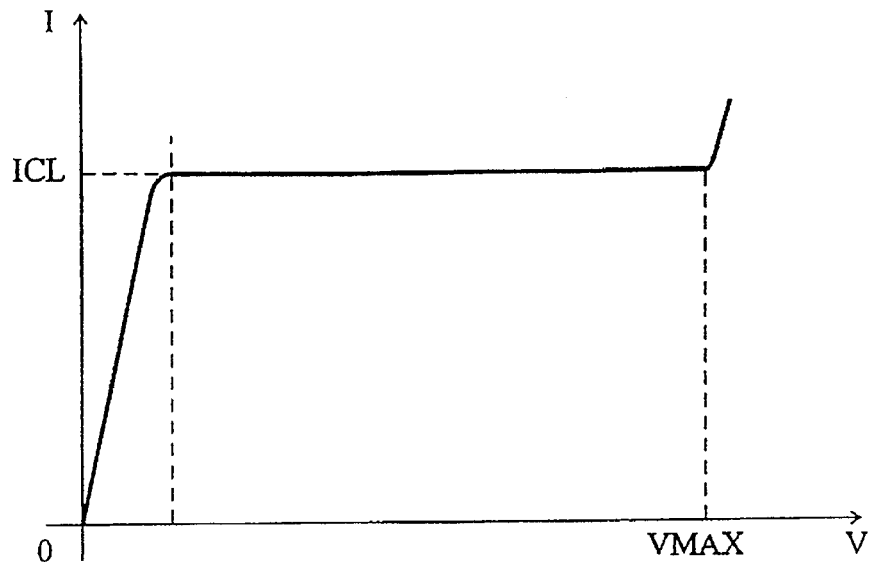
FIG. 1 shows a voltage-current characteristic curve of a current limiting device.

As represented in FIG. 1, a current limiting device, such as the one used according to the invention, has a voltage-current characteristic curve corresponding to that of a MOS transistor having its gate and source interconnected. When the current in this element increases, it acts as a low-value resistor. When the current reaches a limit value "Icl", the current is limited to this value and the voltage across the current limiting device increases. The operative limit of the device is determined by a voltage "Vmax" beyond which the device avalanches.

According, the current limiting device limits the current flowing through the device to the value "Icl" over a range of voltages illustrated in FIG.1 on the voltage axis between the vertical dotted lines.

Figure 2:
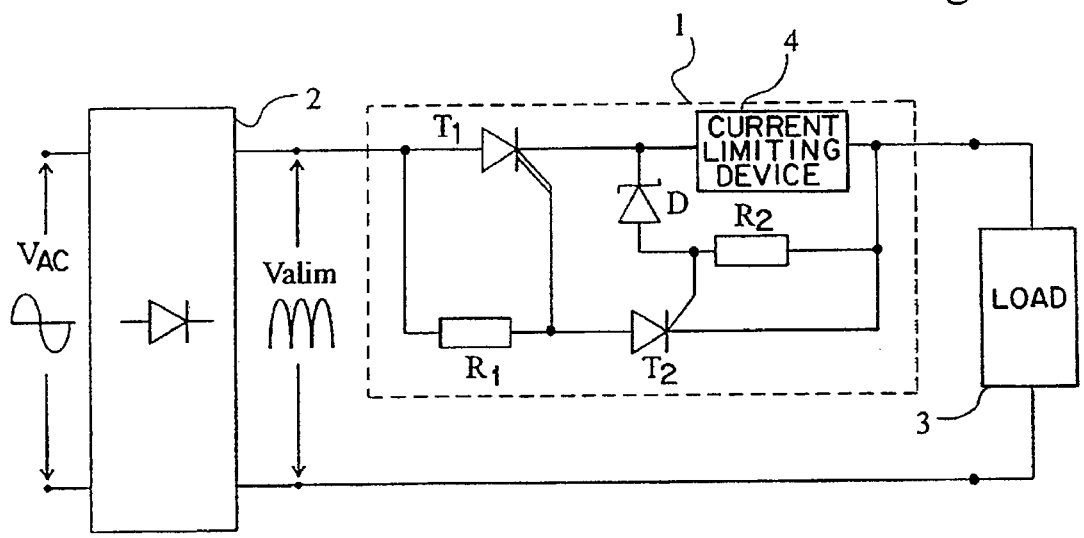
FIG. 2 schematically represents an embodiment of an overcurrent protection device according to the invention.

The protection device 1, according to the invention, such as represented in FIG. 2, receives a rectified and non-filtered sine wave supply signal "Valim", that is provided by a diode bridge 2 fed, for example, by the a.c. voltage "Vac" of the mains at 220 volts. The device 1 provides this rectified signal to a load 3. The device is designed to act as a breaker, that is, to open circuit in the event of an overcurrent due to an overvoltage on the mains, or of a temporary or permanent short-circuiting of the load.

The device 1 includes a gate turnoff thyristor (GTO thyristor) T1 connected in series with a current limiting device 4 and with a load to be protected 3. The anode of the thyristor T1 is connected to the positive terminal of bridge 2. The second terminal of the load 3 is connected to the negative terminal of the bridge 2. The thyristor T1 acts as a switch controlled by a voltage present across the limiting device 4. For this purpose, the gate of the thyristor T1 is connected to the anode of an auxiliary thyristor T2, whose cathode is connected to the output of the current limiting device 4. The gate of the auxiliary thyristor T2 is connected to the anode of an avalanche diode D and, through a resistor R2, to its own cathode. The cathode of the avalanche diode D is connected to the input of the current limiting device 4 so that the diode "measures" the voltage across the current limiting device 4. A high-value resistor R1 is disposed between the anode and the gate of the GTO thyristor T1.

Upon the powering on of the device 1, current flows through the resistor R1, the gate-cathode junction of thyristor T1, the current limiting device 4 and the load 3. As soon this current is sufficient, the thyristor T1 is switched on. When the thyristor T1 is on, a normal load current flows through the current limiting device 4, thus feeding the load 3.

During normal operation, that is, in the absence of an overcurrent or short-circuit condition, the current limiting device 4 operates within its low resistance range (refer to FIG. 1). Thus device 1 has a low power dissipation in normal operation.

In case of an overvoltage from the supply source or of a short-circuit of the load 3, the current flowing through the current limiting device 4 reaches the threshold value "Icl". The operating point of the current limiting device 4 is then within the current limitation ranges, which causes the voltage across the terminals of the current limiting device 4 to be increased.

When this voltage reaches a threshold determined by the avalanche voltage of the diode D, current flows through the diode D and into the gate of the auxiliary thyristor T2, which then becomes conductive.

The triggering of the thyristor T2 causes the voltage difference between the gate and the cathode of the GTO thyristor T1 to reach a highly negative value, thereby blocking the GTO thyristor T1. It will be appreciated that this circuit does not require a high-quality GTO thyristor since, during this turn-off phase, the current limiting device 4 prevents the current in the GTO thyristor T1 from reaching a high value. The two conditions for blocking a GTO thyristor are accordingly satisfied. Device 1 then assumes a high impedance, determined by the value of resistor R1, which blocks the current flow.

During the switching phase, that is, the turn-off of the circuit, the load current remains controlled and equal to the threshold current "Icl" of the current limiting device 4.

In case of a rectified, non-filtered, supply "Valim", that is, a supply exhibiting a zero-crossing at each half-period, thyristor T2 is blocked at the zero-crossing of the signal, which causes the thyristor T1 to switch on at the beginning of the next half-period. Then,.device 1 successively switches off and on at each half-period, as long as the short-circuit remains in the load 3. As soon as the short-circuit disappears, normal operation of the circuit is resumed, and no action is required to reset the protection device 1. Therefore, automatic retriggering is obtained without particular safety measures.

In contrast, in case of a d.c. or rectified and filtered supply (not shown), for the thyristor T2 to switch on when the short-circuit in the load has disappeared, the value of resistor R1 must be selected so that during the occurrence of a nominal voltage of the mains and a normal value of load 3, resistor R1 imposes a current in thyristor T2 lower than its hold current. Then, an automatic retrigerring breaker is obtained.

The function of the low-value resistor R2 is to avoid a spurious triggering of thyristor T2 which could occur, even in the absence of a short-circuit, if a leakage current in the avalanche diode D is sufficient to trigger thyristor T2.

As described above, the load current is permanently controlled by the device 1, which imparts optimal reliability to the circuit.

Figure 3:
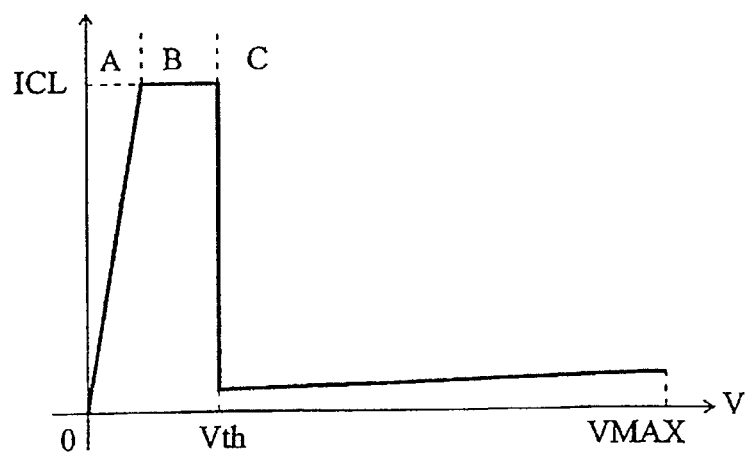
FIG. 3 shows the voltage-current characteristic curve of the device of FIG. 2.

The voltage-current characteristic curve of the device according to the invention such as represented in FIG. 3 illustrates the above-described operation. During normal operation (range A), that is, while the GTO thyristor T1 is on, the characteristic curve of device 1 follows the characteristic curve of the current limiting device 4 (refer to FIG. 1) within its low resistance range. When the current flowing through the device 1 reaches the value "Icl", it is limited to this value (range B), and the characteristic curve follows again that of the current limiting device 4. When the voltage across the device then reaches a threshold value "Vth", corresponding to the threshold voltage of the avalanche diode D plus the gate-cathode junction voltage of thyristor T2, the thyristors switch and the current to the load abruptly drops to reach a value limited by resistor R1 in a switching off range C.

Although the switching time of the circuit is fast, its response time is determined by the avalanche voltage of diode D which may be long. But this delay does not impair the reliability of the circuit or the protection of the load since the load current is permanently limited to value "Icl" by the current limiting device 4.

By way of a non-limiting example, a static breaker according to the invention supplied by a 220-volt a.c. voltage, rectified by a diode bridge, has been formed to feed a load 3 constituted by a 100-W lamp, including the following components:

a current limiting device 4 with a 600-mA current limiting value "Icl";

a gate turnoff (GTO) thyristor T1, marketed under reference TN25–1600D (SOT82), that can be switched off when the current flowing therethrough does not exceed 700mA;

a thyristor T2 marketed under reference PO102A (TO92);

an avalanche diode D having an avalanche voltage of 12 volts;

a 27-kΩ resistor R1; and a 100-Ω resistor R2.

As is apparent to those skilled in the art, various modifications can be made to the above disclosed embodiment, for example, each of the described components can be replaced with one or more elements having the same function.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. An overcurrent protection device, comprising:

a current limiting element, having an input terminal coupled to an electric supply and an output terminal coupled to a load, that limits a current flowing between the input and output terminals and to the load to a value that is substantially constant over a range of voltages;

a sensing circuit, coupled to the input and output terminals of the current limiting element, that generates a control signal at a control terminal of the sensing circuit, the control signal being asserted when a voltage across the current limiting element exceeds a predetermined value; and a switch, disposed in series with the load, which is opened in response to the control signal being asserted, to substantially isolate the electric supply from the load;

wherein the switch includes a gate-turnoff thyristor having an anode, a cathode, and a gate, the anode being coupled to the electric supply and the cathode being coupled to the input terminal of the current limiting element.

2. The device of claim 1, wherein the current limiting element has a voltage-current characteristic curve corresponding to a MOS transistor having its gate and source interconnected.

3. The device of claim, wherein the gate-turnoff thyristor is selected so that it has a maximum turn-off current which is greater than a maximum current of the current limiting element.

4. The device of claim 1, further comprising a first resistor coupled between the anode and the gate of the gate-turnoff thyristor.

5. The device of claim 4, wherein the sensing circuit includes a diode having an anode coupled to the control terminal and a cathode coupled to the input terminal of the current limiting element, and wherein the predetermined value is established by a reverse breakdown voltage of the diode.

6. The device of claim 5, wherein the diode is an avalanche diode.

7. The device of claim 5, further comprising an auxiliary thyristor having an anode coupled to the gate of the gate-turnoff thyristor, a cathode coupled to the output terminal of the current limiting element, and a gate coupled to the control terminal and receiving the control signal, the auxiliary thyristor being triggered on when the control signal is asserted, so that the gate of the gate-turnoff thyristor is pulled negatively with respect to the cathode of the gate-turnoff thyristor.

8. The device of claim 7, wherein the sensing circuit further includes a second resistor coupled between the cathode and the gate of the auxiliary thyristor.

9. The device of claim 8, wherein the second resistor has a value that is selected to be small enough to absorb a leakage current through the diode without turning on the auxiliary thyristor when the diode is not in reverse breakdown.

10. The device of claim 9, wherein the second resistor is further selected to have a value that is large enough so that a voltage developed across the second resistor when the diode is in reverse breakdown is sufficiently large to trigger the auxiliary thyristor to a conductive state.

11. The device of claim 9, wherein the gate-turnoff thyristor is selected so that it has a maximum turn-off current which is greater than a maximum current of the current limiting element.

12. An overcurrent protection device having an input terminal and an output terminal, comprising:

a gate-turnoff thyristor coupled between the input and output terminals, having an anode, a cathode, and a gate;

impedance means coupled between the anode and the gate of the gate-turnoff thyristor, for supplying a gate current to turn on the gate turn-off thyristor when the anode is forward-biased with respect to the gate;

a current limiting device, coupled in series with the gate-turnoff, thyristor that limits a current provided at the output terminal to a predetermined current value;

control means for providing a control signal on a control terminal in response to a voltage across the current limiting device exceeding a predetermined voltage value; and turn-off means, coupled to the gate and operating in response to an assertion of the control signal, for turning off the gate-turn thyristor.

13. The device of claim 12, wherein the gate-turnoff thyristor has a maximum turn-off current value, and wherein the predetermined current value of the current limiting device is less than the maximum turn-off current value.

14. The device of claim 12, wherein the current limiting device has a first and a second terminal, the first terminal being coupled to the cathode and the second terminal being coupled to the output terminal.

15. The device of claim 12, wherein the turn-off means reduces a voltage between the gate and the cathode of the gate-turnoff thyristor.

16. The device of claim 15, wherein the turn-off means includes an auxiliary thyristor having an anode coupled to the gate of the gate-turnoff thyristor, a cathode coupled to the output terminal, and a gate coupled to the control terminal.

17. The device of claim 16, wherein the control means includes a diode having a cathode coupled to the first terminal of the current limiting device and an anode coupled to the control terminal.

18. The device of claim 17, wherein the control signal is asserted in response to the diode assuming a reverse breakdown condition.

19. The device of claim 17, wherein the turn-off means further includes a resistor coupled between the gate and cathode of the auxiliary thyristor.

20. A current limited power supply, comprising:

a rectifier that converts an AC voltage into a rectified voltage at a power terminal;

an overcurrent protection device, coupled to the power terminal and to a load terminal, that limits a current supplied at the load terminal, the overcurrent protection device including:

a gate-turnoff thyristor coupled between the power terminal and the load terminal, the gate-turnoff thyristor having an anode, a cathode, and a gate;

an impedance coupled between the anode and the gate of the gate-turnoff thyristor, that supplies a gate current to turn on the gate-turnoff thyristor when the anode is forward biased with respect to the gate;

a current limiting device, coupled in series with the gate-turnoff thyristor and having first and second terminals, that limits a current between the first and second terminals to a predetermined current value;

control means, coupled in parallel with the current limiting device, for providing a control signal on a control terminal in response to a voltage across the current limiting device exceeding a predetermined voltage value; and turn-off means, coupled to the gate of the gate-turnoff thyristor and operative in response to an assertion of the control signal, for turning off the gate turn-off thyristor.

21. The device of claim 20, wherein the gate-turnoff thyristor has a maximum turn-off current value, and wherein the predetermined current value of the current limiting device is less than the maximum turn-off current value.

22. The device of claim 20, wherein the first terminal of the current limiting device is coupled to the cathode and the second terminal of the current limiting device is coupled to the load terminal.

23. The device of claim 20, wherein the turn-off means reduces a voltage between the gate and the cathode of the gate-turnoff thyristor.

24. The device of claim 23, wherein the turn-off means includes an auxiliary thyristor having an anode coupled to the gate of the gate-turnoff thyristor, a cathode coupled to the load terminal, and a gate coupled to the control terminal.

25. The device of claim 24, wherein the control means includes a diode having a cathode coupled to the first terminal of the current limiting device and an anode coupled to the control terminal.

26. The device of claim 25, wherein the control signal is asserted in response to the diode assuming a reverse breakdown condition.

27. The device of claim 24, wherein the turn-off means further includes a resistor coupled between the gate and cathode of the auxiliary thyristor.

28. A method for protecting a load from an overcurrent condition, comprising the steps of:
   A. limiting a current from a source to the load to a predetermined current value that is substantially constant over a range of voltages;
   B. sensing an overcurrent condition; and
   C. disconnecting the load from the source in response to the overcurrent condition being sensed.

29. The method of claim 28, wherein step A includes passing the current through a current limiting device.

30. The method of claim 29, wherein step B includes the steps of:

detecting a voltage across the current limiting device; and determining whether the voltage detected exceeds a predetermined value.

31. The method of claim 30, wherein step C includes opening a switch when the voltage exceeds the predetermined value.

32. The method of claim 28, wherein step C includes opening a switch coupled between the source and the load when the overcurrent condition is sensed.

33. The method of claim 32, wherein the switch is a gate-turnoff thyristor.

34. The method of claim 28, further comprising a step of:
   D. connecting the load to the source when no overcurrent condition is sensed in step B.

35. The method of claim 34, wherein step D includes a step of determining that a voltage at the source exceeds a voltage at the load.

36. The method of claim 35, wherein step D is performed in response to a determination that the voltage at the source exceeds the voltage at the load.

* * * * *